(12) United States Patent
Akagi et al.

(10) Patent No.: US 7,833,876 B2
(45) Date of Patent: Nov. 16, 2010

(54) SEMICONDUCTOR DEVICE HAVING MULTIPLE ELEMENT FORMATION REGIONS AND MANUFACTURING METHOD THEREOF

(75) Inventors: Nozomu Akagi, Nukata-gun (JP); Yasuhiro Kitamura, Chiryu (JP); Tetsuo Fujii, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/230,209

(22) Filed: Aug. 26, 2008

(65) Prior Publication Data

US 2009/0057812 A1 Mar. 5, 2009

(30) Foreign Application Priority Data

Aug. 27, 2007 (JP) ............................ 2007-220240
Apr. 15, 2008 (JP) ............................ 2008-106014

(51) Int. Cl.
*H01L 21/76* (2006.01)

(52) U.S. Cl. .................. 438/430; 438/454; 257/409; 257/488; 257/659; 257/E21.572

(58) Field of Classification Search ............... None
See application file for complete search history.

(56) References Cited

U.S. PATENT DOCUMENTS

| | | | |
|---|---|---|---|
| 4,612,408 A | 9/1986 | Moddel et al. | |
| 5,122,856 A | 6/1992 | Komiya | |
| 5,354,695 A | 10/1994 | Leedy | |
| 5,442,223 A | 8/1995 | Fujii | |
| 5,841,197 A | 11/1998 | Adamic, Jr. | |
| 5,869,354 A | 2/1999 | Leedy | |
| 6,084,284 A * | 7/2000 | Adamic, Jr. | 257/506 |
| 6,369,426 B2 | 4/2002 | Blanchard et al. | |
| 6,423,573 B1 | 7/2002 | Gidon | |
| 6,524,890 B2 | 2/2003 | Ueda et al. | |

(Continued)

FOREIGN PATENT DOCUMENTS

DE 19800715 7/1999

(Continued)

OTHER PUBLICATIONS

Office Action mailed Jan. 6, 2010 from the Japan Patent Office for corresponding patent application No. 2008-106014 (English translation enclosed).

(Continued)

*Primary Examiner*—Thanh V Pham
*Assistant Examiner*—Andres Munoz
(74) *Attorney, Agent, or Firm*—Posz Law Group, PLC

(57) ABSTRACT

In a manufacturing of a semiconductor device, at least one of elements is formed in each of element formation regions of a substrate having a main side and a rear side, and the substrate is thinned by polished from a rear side of the substrate, and then, multiple trenches are formed on the rear side of the substrate, so that each trench reaches the main side of the substrate. After that, an insulating material is deposited over an inner surface of each trench to form an insulating layer in the trench, so that the element formation regions are isolated. Thereby, generation of cracks and structural steps in the substrate and separation of element formation regions from the substrate can be suppressed.

12 Claims, 10 Drawing Sheets

U.S. PATENT DOCUMENTS

| | | | |
|---|---|---|---|
| 6,597,053 B1 * | 7/2003 | Anthofer et al. | 257/508 |
| 6,878,605 B2 * | 4/2005 | Kim et al. | 438/424 |
| 6,879,029 B2 | 4/2005 | Ueda et al. | |
| 7,427,803 B2 * | 9/2008 | Chao et al. | 257/659 |
| 7,531,407 B2 * | 5/2009 | Clevenger et al. | 438/238 |
| 7,537,982 B2 * | 5/2009 | Lien et al. | 438/154 |
| 2006/0001147 A1 | 1/2006 | Tomita et al. | |
| 2006/0172494 A1 | 8/2006 | Kohlmann-Von Platen et al. | |
| 2006/0220178 A1 | 10/2006 | Kubo et al. | |
| 2007/0029636 A1 * | 2/2007 | Kanemaru et al. | 257/510 |
| 2007/0264753 A1 | 11/2007 | Tomita et al. | |
| 2008/0135932 A1 | 6/2008 | Ozeki et al. | |
| 2008/0224174 A1 * | 9/2008 | Sasaki et al. | 257/197 |
| 2008/0237808 A1 | 10/2008 | Kubo et al. | |
| 2008/0290524 A1 * | 11/2008 | Lanzerotti et al. | 257/770 |
| 2010/0078776 A1 * | 4/2010 | Barth et al. | 257/659 |
| 2010/0176480 A1 * | 7/2010 | Senda et al. | 257/501 |

FOREIGN PATENT DOCUMENTS

| | | |
|---|---|---|
| DE | 19806819 | 8/1999 |
| JP | A-62-130537 | 6/1987 |
| JP | A-05-067676 | 3/1993 |
| JP | A-7-161809 | 6/1995 |
| JP | A-10-027767 | 1/1998 |
| JP | A-2007-035729 | 2/2007 |

OTHER PUBLICATIONS

Search Report mailed Sep. 3, 2010 in corresponding European patent application No. 08014382.9 (Engligh translation enclosed).

* cited by examiner

SEMICONDUCTOR DEVICE HAVING MULTIPLE ELEMENT FORMATION REGIONS AND MANUFACTURING METHOD THEREOF

CROSS REFERENCE TO RELATED APPLICATIONS

This application is based on Japanese Patent Applications No. 2007-220240 filed on Aug. 27, 2007, and No. 2008-106014 filed on Apr. 15, 2008, the disclosures of which are incorporated herein by reference.

FIELD OF THE INVENTION

The present invention relates to a semiconductor device having multiple element formation regions and a manufacturing method thereof.

BACKGROUND OF THE INVENTION

According to a manufacturing method of the semiconductor device disclosed in JP-A-2001-144173 corresponding to U.S. Pat. No. 6,524,890 and U.S. Pat. No. 6,879,029, a wafer for forming elements is prepared, and trenches each having a predetermined depth from a main side of the wafer are formed firstly. Subsequently, the trenches are filled with an insulating layer, and then, the wafer is thinned by chemical mechanical polishing from a rear side of the wafer, so that the insulating layer is exposed. Thereby, the insulating layer penetrates the wafer and element formation regions can be isolated by the insulating layer.

In the above-mentioned manufacturing method, after the trenches each having the predetermined depth from the main side of the wafer is filled with the insulating layer, the wafer is thinned by chemical mechanical polishing from the rear side of the wafer. Thus, a surface including both a silicon substrate configuring the wafer and the insulating layer made of such as an oxide film needs to be polished. Therefore, stress due to polishing is concentrated at an interface between the silicon substrate and the insulating layer, and cracks may generate in the silicon substrate, for example. In addition, in case that the wafer is thinned by etching not polishing, structural steps may generate over the rear side of the wafer due to the difference of etching rate between the silicon substrate and the insulating layer.

Moreover, in case that the trenches are not filled sufficiently with the insulating layer, the element formation regions may separate from the wafer by force applied to the element formation regions while the wafer is thinned.

SUMMARY OF THE INVENTION

It is an object of the present disclosure to provide a manufacturing method of a semiconductor device having multiple element formation regions. It is another object of the present disclosure to provide a semiconductor device having multiple element formation regions.

According to a first aspect of the present disclosure, a method for manufacturing a semiconductor device includes preparing a semiconductor substrate having a main side and a rear side; forming at least one of an active element and a passive element in each of a plurality of element formation regions of the substrate at the main side of the substrate; forming an insulating film over the main side of the substrate; thinning the substrate from the rear side of the substrate; forming a plurality of trenches on the rear side of the substrate in such a manner that each trench reaches the insulating film and surrounds a corresponding one of the plurality of element formation regions after the thinning the substrate; and depositing an insulating material over an inner surface of each trench to form an insulating layer in the trench, so that the plurality of element formation regions are isolated from each other.

According to the above configuration, a manufacturing method of a semiconductor device having multiple element formation regions, which suppresses generation of cracks and structural steps and separation of element formation regions, and a semiconductor device formed by the manufacturing method can be obtained.

According to a second aspect of the present disclosure, a semiconductor device includes a semiconductor substrate having a main side and a rear side; a plurality of element formation regions disposed in the substrate; a plurality of trenches, each of which penetrates the substrate, and surrounds a corresponding element formation region; an insulating layer arranged over an inner surface of each trench for isolating the plurality of element formation regions from each other; and at least one of an active element and a passive element arranged in each of the plurality of element formation regions at the main side of the substrate. The insulating layer is arranged over the rear side of the substrate. The insulating layer in each trench is continuously connected to the insulating layer over the rear side.

According to the above configuration, a manufacturing method of a semiconductor device having multiple element formation regions, which suppresses generation of cracks and structural steps and separation of element formation regions, and a semiconductor device formed by the manufacturing method can be obtained.

According to a third aspect of the present disclosure, a method for manufacturing a semiconductor device includes preparing a semiconductor substrate having a main side and a rear side; forming at least one of an active element and a passive element in each of a plurality of element formation regions of the substrate at the main side of the substrate; forming an insulating film over the main side of the substrate; forming a conductive body over the insulating film; thinning the substrate from the rear side of the substrate; forming a plurality of trenches on the rear side of the substrate after the thinning the substrate, wherein each trench reaches the insulating film; depositing an insulating material over a sidewall of each trench to form an insulating layer with a void in the trench, so that the plurality of element formation regions are isolated, wherein the void is formed in the insulating layer around a central axis of the trench; depositing the insulating material over the rear side of the substrate; removing the insulating film over one of the trenches, so that the conductive body is exposed from the rear side of the substrate; depositing a conductive material in the void in each trench and in the one of the trenches; and depositing the conductive material over the rear side of the substrate. The conductive body is electrically coupled with the conductive material over the rear side of the substrate through the conductive material in the one of the trenches.

According to the above configuration, a manufacturing method of a semiconductor device having multiple element formation regions, which suppresses generation of cracks and structural steps and separation of element formation regions, and a semiconductor device formed by the manufacturing method can be obtained.

According to a fourth aspect of the present disclosure, a semiconductor device includes a semiconductor substrate having a main side and a rear side; a plurality of element formation regions disposed in the substrate; a plurality of trenches, each of which penetrates the substrate, and surrounds a corresponding element formation region; an insulating layer arranged at least over a sidewall of each trench for isolating the plurality of element formation regions from each other, and arranged over the rear side of the substrate; a conductive material arranged on the insulating layer in each trench to fill the trench; at least one of an active element and a passive element arranged in each of the plurality of element formation regions at the main side of the substrate; and a conductive body arranged over the main side of the substrate. The conductive material is arranged over the rear side of the substrate and the conductive material in each trench is continuously connected to the conductive material over the rear side. The conductive material in at least one of the trenches contacts the conductive body, and the conductive body is electrically coupled with the conductive material over the rear side of the substrate through the conductive material in the at least one of the trenches.

According to the above configuration, a manufacturing method of a semiconductor device having multiple element formation regions, which suppresses generation of cracks and structural steps and separation of element formation regions, and a semiconductor device formed by the manufacturing method can be obtained.

According to a fifth aspect of the present disclosure, a method for manufacturing a semiconductor device includes preparing a semiconductor substrate having a main side and a rear side; forming at least one of an active element and a passive element in each of a plurality of element formation regions of the substrate at the main side of the substrate; forming an insulating film over the main side of the substrate; thinning the substrate from the rear side of the substrate; forming a plurality of trenches on the rear side of the substrate after the thinning the substrate, wherein each trench reaches the insulating film; depositing a first insulating material over a sidewall of each trench to form a first insulating layer with a first void in the trench, so that the plurality of element formation regions are isolated, wherein the first void is formed in the first insulating layer around a central axis of the trench; and depositing a first conductive material in the first void in each trench and over the rear side of the substrate. The plurality of element formation regions are electrically shielded by fixing a potential of the first conductive material in each trench and over the rear side of the substrate.

According to the above configuration, a manufacturing method of a semiconductor device having multiple element formation regions, which suppresses generation of cracks and structural steps and separation of element formation regions, and a semiconductor device formed by the manufacturing method can be obtained.

According to a sixth aspect of the present disclosure, a semiconductor device includes a semiconductor substrate having a main side and a rear side; a plurality of element formation regions disposed in the substrate; a plurality of trenches, each of which penetrates the substrate, and surrounds a corresponding element formation region; a first insulating layer arranged at least over a sidewall of each trench for isolating the plurality of element formation regions from each other, and arranged over the rear side of the substrate; a first conductive material arranged on the first insulating layer in each trench to fill the trench; and at least one of an active element and a passive element arranged in each of the plurality of element formation regions at the main side of the substrate. The first conductive material is arranged over the rear side of the substrate, and the first conductive material in each trench is continuously connected to the first conductive material over the rear side. The plurality of element formation regions are electrically shielded by fixing a potential of the first conductive material in each trench and over the rear side of the substrate.

According to the above configuration, a manufacturing method of a semiconductor device having multiple element formation regions, which suppresses generation of cracks and structural steps and separation of element formation regions, and a semiconductor device formed by the manufacturing method can be obtained.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
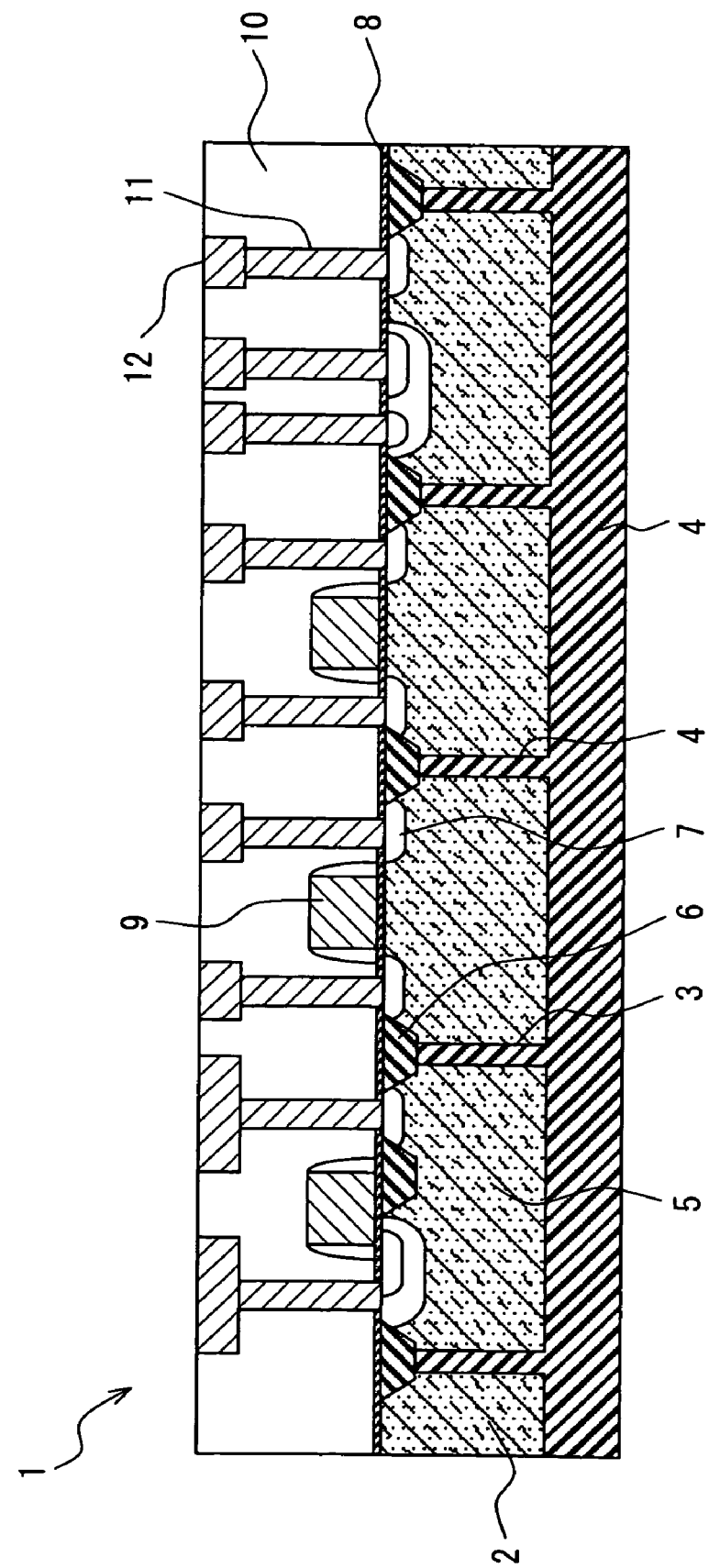
FIG. 1 is a cross sectional view showing a structure of a substantial portion of a semiconductor device having an element isolation structure according to a first embodiment.

Hereinafter, embodiments of the present disclosure will be described with reference to the drawings. FIG. 1 is a cross sectional view showing a structure of a substantial portion of a semiconductor device having an element isolation structure according to a first embodiment.

As shown in FIG. 1, a semiconductor device includes a plurality of isolated element formation regions 5 over a wafer substrate 2 for forming elements, which is made of a silicon substrate. At least one of active elements (a transistor and a diode or the like) and passive elements (a resistor and a capacitor or the like) using the silicon substrate as a semiconductor substrate (a wafer substrate) is formed in each of the plurality of element formation regions 5. For example, in case of the transistor, impurity regions 7 are formed by implanting an impurity appropriately, which has opposite conductive type from the silicon substrate, from the main side of the silicon substrate. The impurity regions 7 function as a source region and a drain region. By applying voltage to a gate electrode 9, a channel is formed between the source region and the drain region, so that current flows therebetween.

Trenches 3 are formed to surround the plurality of element formation regions 5. An insulating material such as silicon oxide is deposited, so that an insulating layer 4 is formed inside the trenches 3 and over a rear side of the wafer substrate 2. The plurality of element formation regions 5 are isolated each other by the insulating layer 4.

The trenches 3 which are filled with the insulating layer 4 are formed by etching from the rear side of the wafer substrate 2 as described below. In the etching process, LOCOS (i.e., local oxidation of silicon) films 6 as insulating films formed in a surface portion of the wafer substrate 2 are used as etching stoppers. Thus, each of bottoms of the trenches 3 (each of end portions at the main side of the silicon substrate) contacts the corresponding LOCOS film to terminate. STI (i.e., shallow trench isolation) films may be used as the etching stoppers not LOCOS films. It is possible to use interlayer insulating films such as BPSG (i.e., boro-phospho silicate glass) films as etching stoppers. However, it is preferable to use insulating oxide films such as the above-mentioned LOCOS films and STI films, which have the thickness greater than or equal to sub-microns, in order to improve etching selectivity with the silicon substrate.

A thermal oxide film 8 is formed over the main side of the wafer substrate 2 after forming the above-mentioned active elements and passive elements. The above-mentioned gate electrode 9 is formed over the thermal oxide film 8. The gate electrode 9 is made from a conductive body such as polysilicon, tungsten and aluminum. After that, an interlayer insulating film 10 such as a BPSG film and an NSG film is deposited and formed over the thermal oxide film 8 or the gate electrode 9. Moreover, electrodes 11 and pads 12 of the active elements and the passive elements, which are formed in the plurality of element formation regions 5, are formed at portions in which the interlayer insulating film 10 and the thermal oxide film 8 are removed by etching.

Next, a manufacturing method of the semiconductor device 1 having the above-mentioned structure will be described with reference to FIGS. 2A to 2E.

Figure 2A:
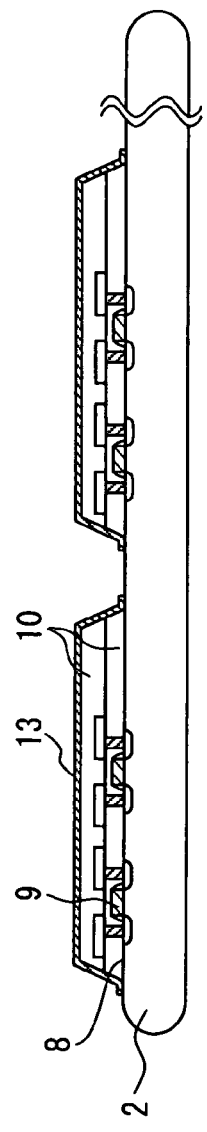
FIGS. 2A to 2E are cross sectional views showing a manufacturing method of the semiconductor device according to the first embodiment.

As shown in FIG. 2A, the wafer substrate 2 for forming elements, which is made of the silicon substrate, is prepared firstly. Desired elements are formed in each of the element formation regions 5 from the main side of the silicon substrate. After that, the thermal oxide film 8, the gate electrode 9, the interlayer insulating films 10, electrodes 11, and a passivation films 13 or the like are formed. According to the manufacturing method of the present embodiment, the semiconductor elements each having the foregoing structure are formed firstly over a plurality of regions of the wafer substrate 2.

Figure 2B:
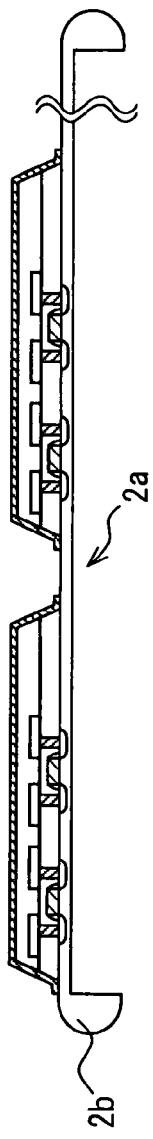

Next, as shown in FIG. 2B, the wafer substrate 2 is thinned by mechanical polishing from the rear side of the wafer substrate 2 (thinning step). In this case, unlike the conventional way that a surface including both a semiconductor substrate and an insulating layer is polished, a surface including only a semiconductor substrate is polished. Thus, the rear side of the wafer substrate 2 can be polished uniformly without generating cracks and structural steps by ordinaly mechanical polishing. Polishing is not limited to the mechanical polishing. Techniques such as chemical mechanical polishing, wet etching and dry etching may be used.

Moreover, in the thinning process, the wafer substrate 2 is polished until the thickness of the wafer substrate 2 becomes less than or equal to 150 μm, for example. Thereby, it becomes easy to form the trenches 3 and to deposit the insulating material inside the trenches 3. However, as the thickness of the wafer substrate 2 becomes thin, the mechanical strength of the wafer substrate 2 decreases. Therefore, cracks may generate in the wafer substrate 2 and handling the wafer substrate 2 may become difficult.

Therefore, it is common that the wafer substrate 2 is thinned with a supporting base attached to the main side of the wafer substrate 2 for keeping the mechanical strength when the wafer substrate 2 is thinned by polishing from the rear side of the wafer substrate 2. Alternatively, the supporting base may not be attached. In this case, it is preferable that only a central region 2a surrounded by outer regions 2b is polished, not a whole surface of the wafer substrate 2. Hereby, only the central region 2a is thinned, and the outer regions 2b remain without being thinned the thickness thereof. As a result, the decrease of the mechanical strength can be suppressed even if the wafer substrate 2 is thinned.

Moreover, in the process that the supporting base is attached, it becomes difficult to perform the process in the atmosphere greater than or equal to 200 degree Celsius because of the restriction of the retention temperature of an adhesive used for the attachment. However, as described above, the supporting base is not needed when the outer regions 2b of the wafer substrate 2 remain without being thinned, it becomes possible to perform in the atmosphere greater than or equal to 200 degree Celsius. It is preferable that the thickness of the outer regions 2b are greater than or equal to 250 μm to suppress the decrease of the mechanical strength.

Figure 2C:
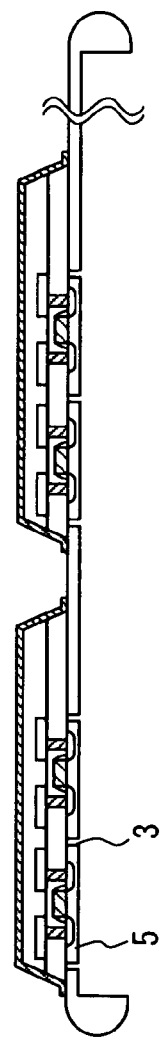

Next, as shown in FIG. 2C, the trenches 3 are formed by dry etching from the rear side of the wafer substrate 2, which is thinned. The trenches 3 are formed to surround each of the element formation regions 5. The etching stops by the insulating films when the trenches 3 reach the insulating films (the LOCOS films 6) in the surface portion of the wafer substrate 2.

In the present embodiment, when the trenches 3 are formed, the thermal oxide film 8, the interlayer insulating films 10 have been already formed over the wafer substrate 2. Although the trenches 3 penetrating the wafer substrate 2 are formed to surround each of the plurality of element formation regions 5, each of the regions of the wafer substrate 2 including the plurality of element formation regions 5 remains to couple with the semiconductor elements through the thermal oxide film 8 formed over the surface of the wafer substrate 2. Therefore, separation of the element formation regions 5 can be prevented.

Figure 2D:
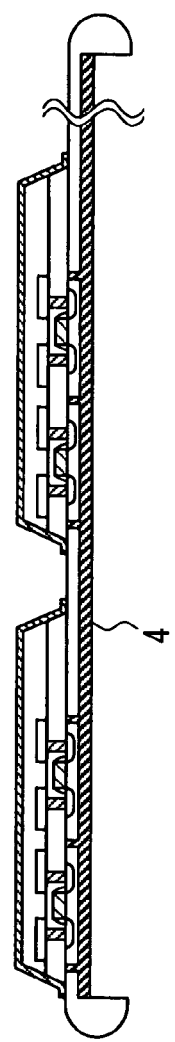

Next, as shown in FIG. 2D, an insulating material such as silicon oxide is deposited from the rear side of the wafer substrate 2 by direct oxidation, chemical vapor deposition or the like. The trenches 3 are filled with the insulating material, so that the insulating layer 4 is formed inside the trenches 3. Therefore, the insulating layer 4 is arranged between two adjacent element formation regions 5 in the wafer substrate 2, and the adjacent element formation regions 5 are isolated. Moreover, the insulating material continued from the inside the trenches 3 is deposited also over the rear side of the wafer substrate 2, so that the insulating layer 4 is formed. Thereby, protection of the rear side of the wafer substrate 2 and the insulation property can be ensured.

In the present embodiment, as described above, since each of the regions of the wafer substrate 2 can remain to couple with the semiconductor elements by the thermal oxide film 8 or the like formed over the main side of the wafer substrate 2, being coupling with each of the regions of the wafer substrate 2 by filling the trenches 3 with the insulating layer 4 is not always needed. For example, the insulating material is deposited over inner surfaces of the trenches 3, and voids may remain in vicinity of central axes inside the trenches 3.

Figure 2E:
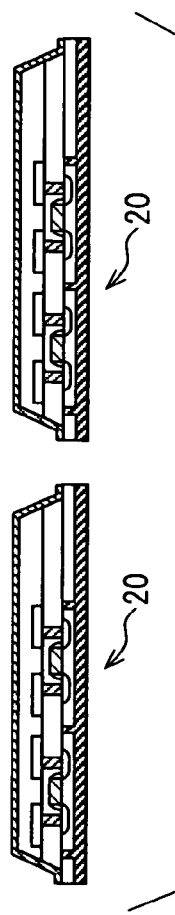

Finally, as shown in FIG. 2E, the wafer substrate 2 is divided into a plurality of chips 20 by die cutting (the separation process). In the separation process, the outer regions 2b remaining without being thinned are separated from the plurality of chips 20. A semiconductor chip 20 having an element isolation structure according to the present embodiment is completed through the above-mentioned steps.

Second Embodiment

Figure 3:
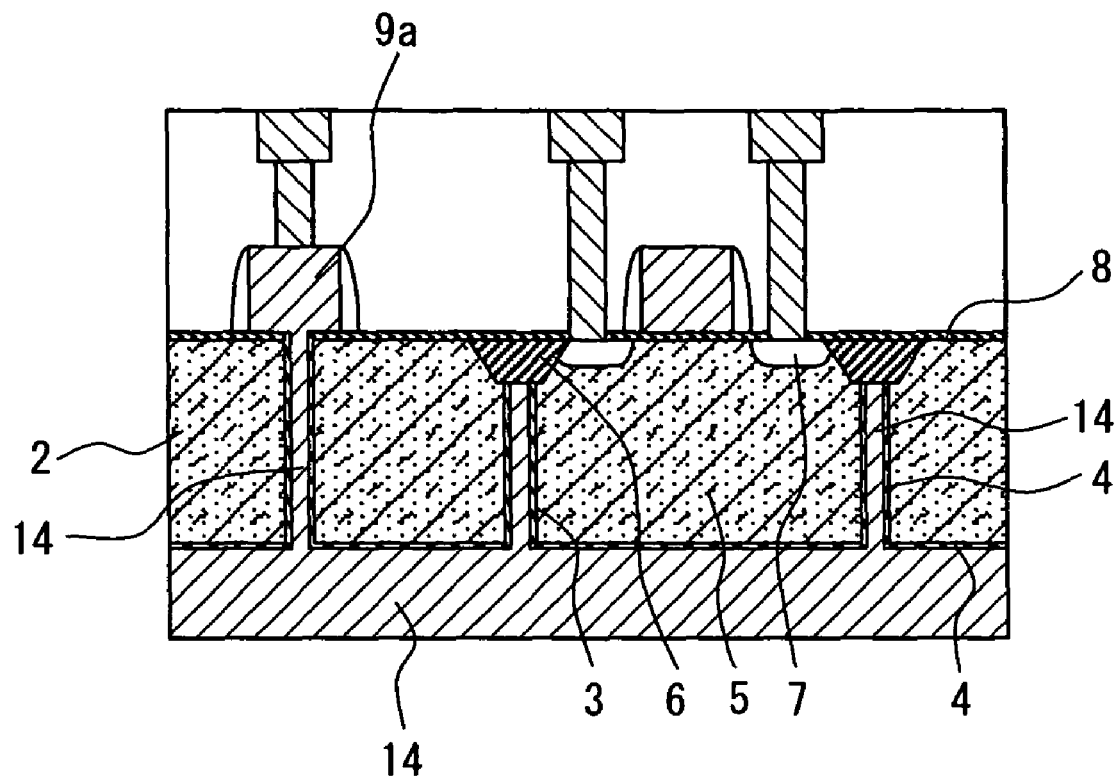
FIG. 3 is a cross sectional view showing a structure of a substantial portion of a semiconductor device having an element isolation structure according to a second embodiment.

Next, a second embodiment of the present disclosure will be described. FIG. 3 is a cross sectional view showing a structure of a substantial portion of a semiconductor device having an element isolation structure according to the second embodiment.

The differences between the first embodiment and the second embodiment are that, an insulating material is deposited over surfaces of sidewalls of trenches 3, voids in vicinity of central axes of the trenches 3a are filled with a conductive material 14 made of metal having relatively low melting point, for example, less than or equal to 1100 degree Celsius (such as copper or aluminum), and the conductive material 14 in a portion of the trenches 3 is electrically coupled with an electrode 9a formed over a surface of a wafer substrate 2, in a semiconductor device of the second embodiment. However, polysilicon having relatively high melting point may be used as the conductive material 14. The structure of the semiconductor device and the manufacturing method thereof according to the second embodiment are similar to those according to the first embodiment.

The insulating layer 4 is formed between each of two adjacent element formation regions 5, and the DC component of the electrical signal generated in each of the element formation regions 5 can be blocked. However, since the AC component of the electrical signal can not be blocked completely, a malfunction may occur by propagation of the AC component. However, the interference of electric potential by the AC component between the adjacent element formation regions 5 can be prevented by fixing electric potential of the conductive material 14 in the trenches 3 surrounding the element formation regions 5, as shown in the above-mentioned configuration.

It is noted that the structure which can obtain the electrical shield between the isolated element formation regions is disclosed in JP-A-H04-154147 corresponding to U.S. Pat. No. 5,442,223. Specifically, a plurality of element formation regions are formed over an SOI substrate, and trenches between the element formation regions covered by an oxide film are filled with a polysilicon film.

However, in the element isolation structure like this, a conductive layer has already been formed over lower sides and lateral sides of the element formation regions in the semiconductor element forming steps. Therefore, in order to stand high temperature thermal treatment in the element forming steps, polysilicon or a high melting point metal such as tungsten needs to be used as the conductive layer, and the resistivity of the conductive layer becomes high. Moreover, in the conventional element isolation structure, the SOI substrate is used to arrange the conductive layer over lower sides of the element formation regions. In addition to using the conductive layer having high melting point, the manufacturing cost becomes high.

On the other hand, in the present embodiment, trenches 3 can be filled with the conductive material 14 after forming elements in the plurality of element formation regions 5. Therefore, metal having relatively low melting point such as aluminum or copper can be used for the conductive material 14. Moreover, the conductive material 14 can surround the plurality of element formation regions 5 by just depositing the conductive material 14, so that the manufacturing cost can be decreased.

In order to fill trenches 3 with the conductive material 14, firstly, voids remain in vicinity of central axes of the trenches 3 and the insulating material is deposited over surfaces of sidewalls of the trenches 3, so that the insulating layer 4 is formed over inner surfaces of the trenches 3. At this time, the insulating material is deposited and the insulating layer 4 is formed over the rear side of the wafer substrate 2.

Next, in one of the trenches 3 which is arranged opposite to the electrode 9a formed over the main side of the wafer substrate 2 through the thermal oxide film 8, in case that an insulating material is deposited over a bottom of the one of the trenches 3 at the main side of the wafer substrate 2, the insulating material and the thermal oxide film 8 are removed by anisotropic etching such as ion beam etching, so that the electrode 9a is exposed at the bottom of the one of the trenches 3. And then, voids located in vicinity of central axes of the trenches 3 including the one of the trenches 3, in which the electrode 9a is exposed, are filled with the conductive material 14, and the conductive material 14 is deposited over the rear side of the wafer substrate 2. Thereby, the electrode 9a over the main side of the wafer substrate 2 can be electrically coupled with the conductive material 14 over the rear side of the wafer substrate 2 through the conductive material 14 inside the one of the trenches 3. Thereby, the conductive material 14 which is terminated in other trenches of trenches 3 except the one of the trenches 3 can also be electrically coupled with the electrode 9a over the main side of the wafer substrate 2.

In this structure, when applying a predetermined potential to the electrode 9a over the main side of the wafer substrate 2, the conductive material 14 arranged inside the trenches 3 and over the rear side of the wafer substrate 2, which is electrically coupled with the electrode 9a, is fixed to the predetermined potential. Therefore, the interference of electric potential by the AC component between the adjacent element formation regions 5 can be prevented. It is preferred that the predetermined potential is fixed to the ground potential. Thereby, the electric power consumption can be reduced and the interference of electric potential between the adjacent element formation regions can be prevented.

Third Embodiment

Figure 4:
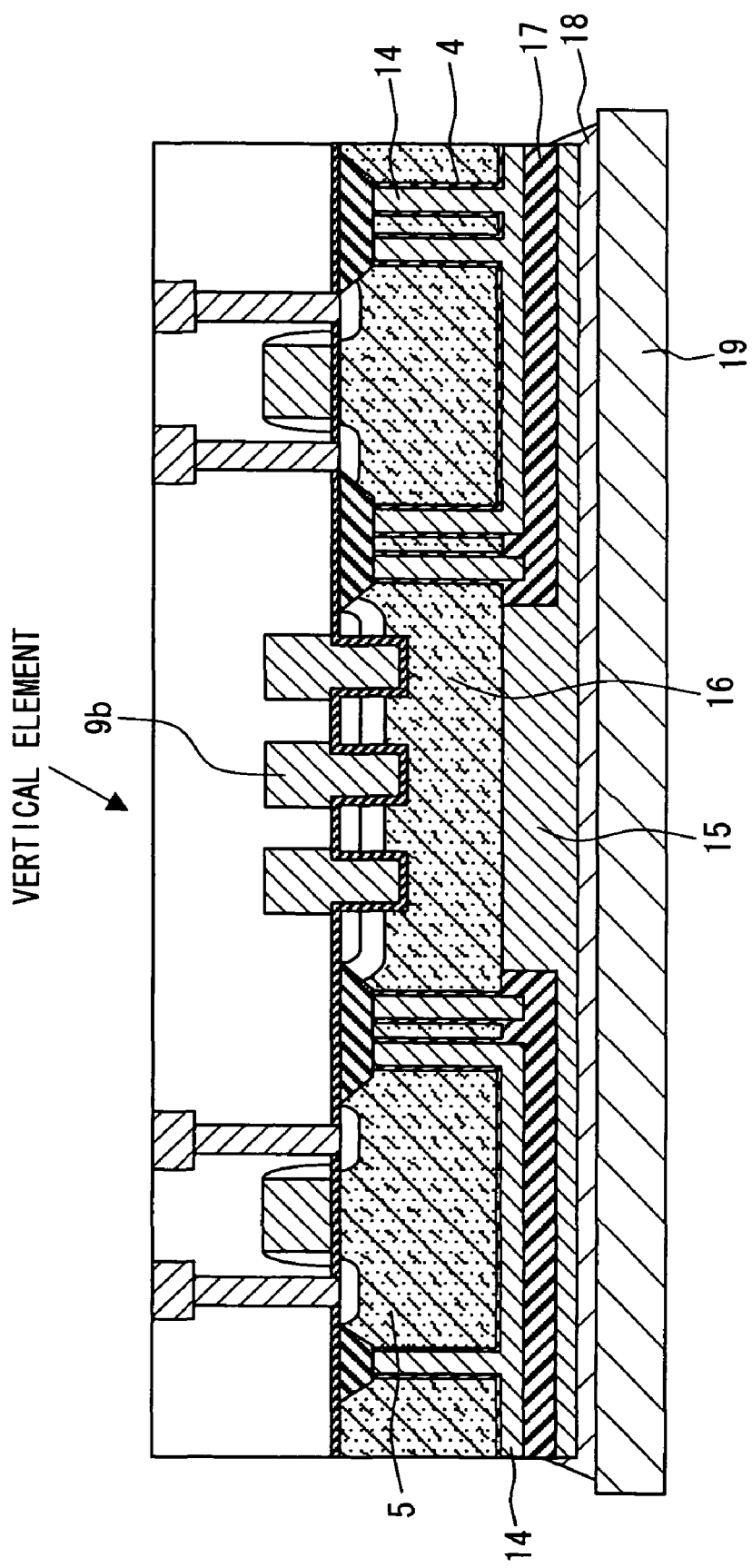
FIG. 4 is a cross sectional view showing a structure of a substantial portion of a semiconductor device having an element isolation structure according to a third embodiment.

Next, a third embodiment of the present disclosure will be described. FIG. 4 is a cross sectional view showing a structure of a substantial portion of a semiconductor device having an element isolation structure according to the third embodiment.

In the present embodiment, one of the element formation regions 5 is replaced by a vertical element formation region 16, and a surface electrode 9b is formed over a main side of a wafer substrate 2, and a back surface electrode 15 is formed over a rear side of the wafer substrate 2. Moreover, the back surface electrode 15 is joined to a conductive plate 19 through a conductive joining member 18. Although not shown in the drawings, the other structures of the semiconductor device of the third embodiment are same as those of the second embodiment including a structure that the conductive material 14 arranged inside the trenches 3 and over the rear side of the wafer substrate 2 is fixed to the predetermined potential by the electrode 9a formed over the main side of the wafer substrate 2.

The back surface electrode 15 deposited over the rear side of the wafer substrate 2 is formed by the same material with the conductive material 14, for example. An insulating layer 17 is formed between the back surface electrode 15 and the conductive material 14 for obtaining isolation. In order to obtain the structure having the back surface electrode, firstly, the conductive material 14 having a predetermined thickness is deposited over the rear side of the wafer substrate 2. After that, a portion of the conductive material 14, in which the back surface electrode 15 of the vertical element formation region 16 is formed later, and a region surrounding the portion are removed by etching. Next, an insulating material such as silicon oxide is deposited by chemical vapor deposition or the like to form the insulating layer 17. And then, a portion of the insulating layer 17, in which the back surface electrode 15 is formed later, is removed by etching, and another conductive material is deposited over the rear side of the wafer substrate 2 to form the back surface electrode 15. When the portion of the insulating layer 17, in which the back surface electrode 15 is formed later, is removed, an insulating layer 4, which has already been formed, is also removed.

After that, the back surface electrode 15 is joined to the conductive plate 19 with the joining member 18 made of such as solder, silver paste or metallic nanoparticle, for example. The conductive plate 19 is a metal frame supporting a semiconductor chip 20 when the semiconductor ship 20 is packaged, or a copper foil provided over a surface of a mother board when the semiconductor chip 20 is mounted on the mother board.

That is, in the semiconductor device of the third embodiment, two conductive materials are laminated over the rear side of the wafer substrate 2 through the insulating layer 17, the conductive material 14 for electrically shielding the element formation regions 5 is isolated from the layers including the conductive materials such as the joining member 18 and the conductive plate 19, which are formed over an opposite surface to a surface attached to the wafer substrate 2, by the insulating layer 17. On the other hand, the conducting material for providing the back surface electrode 15 of the vertical element formation region 16 penetrates the insulating layer 17 so that the back surface electrode 15 is electrically coupled with the layers including the conductive materials, which are formed over the opposite surface. Therefore, the layers including the conductive materials become a part of the back surface electrode 15.

According to the semiconductor device of the third embodiment configured as described above, even if the back surface electrode 15 of the vertical element formation region 16 is formed over the rear side of the wafer substrate 2, with respect to the element formation regions 5 other than the vertical element formation region 16, the conductive material 14 for electrically shielding each of the element formation regions 5 can be formed over the rear side of the wafer substrate 2. The conductive plate 19 can be used as a connecting terminal of the back surface electrode 15 by joining the conductive plate 19 to the back surface electrode 15. Moreover, the conductive plate 19 promotes heat release of the element formation regions 5 and 16, and heat release property can be improved.

Figure 5:
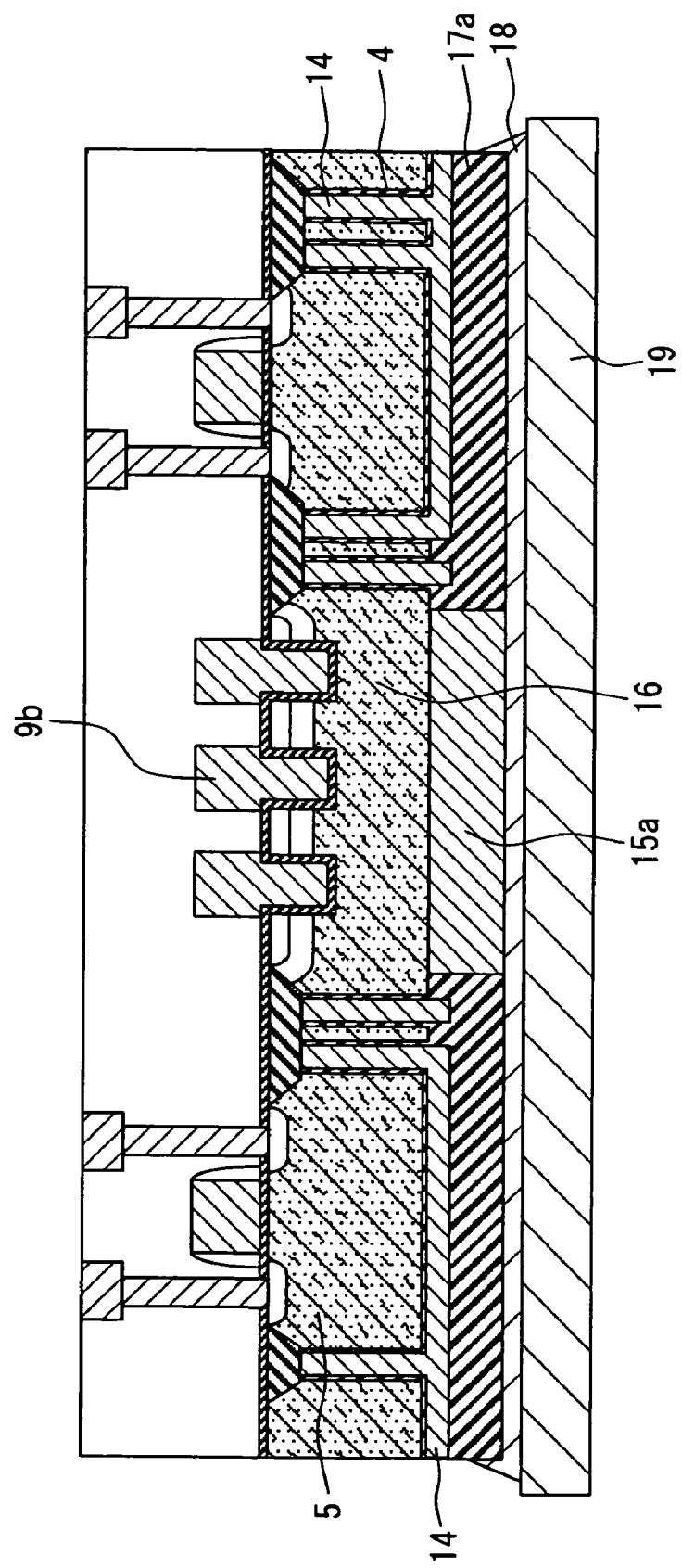
FIG. 5 is a cross sectional view showing a structure of a substantial portion of a semiconductor device according to a modification of the third embodiment.

Next, a modification of the third embodiment will be described. FIG. 5 is a cross sectional view showing a structure of a substantial portion of a semiconductor device according to the modification of the third embodiment. In the above-mentioned third embodiment, two conductive materials are laminated with the insulating layer 17 interposed therebetween. On the other hand, in the modification shown in FIG. 5, the conductive material 14 for electrically shielding the element formation regions 5 is a single-layered structure, and a back surface electrode 15a of the vertical element formation region 16 is formed to be thicker than the conductive material 14. An insulating layer 17a having a thickness which equals to the difference between the back surface electrode 15a and the conductive material 14 is formed over the conductive material 14. Therefore, the back surface electrode 15a and the insulating layer 17a provide the same surface opposite to the surface attached to the wafer substrate 2. The surface configured by the back surface electrode 15a and the insulating layer 17a is joined to the conductive plate 19 through the conductive joining member 18.

In this structure, the back surface electrode 15a is isolated from the conductive material 14 by the insulating layer 17a. Since the thickness of the back surface electrode 15a of the vertical element formation region 16 is larger than that of the conductive material 14 for electrically shielding the element formation regions 5, the conductive plate 19 is electrically coupled with only the back surface electrode 15a. Therefore, the conductive plate 19 can be used as the connecting terminal of the back surface electrode 15a.

Fourth Embodiment

Next, a fourth embodiment of the present disclosure will be described. In the above-mentioned second and third embodiments, potential of the conductive material 14 in the trenches 3 and over the rear side of the wafer substrate 2 are fixed to the predetermined potential by conducting the electrode 9a formed over the main side of the wafer substrate 2 with the conductive material 14 in the trenches 3. However, since electrode wirings of each of elements or the like need to be formed over the main side of the wafer substrate 2, a space for providing the electrode 9a is limited. Thus, radiuses of the conductive material 14 in the trenches 3 are small, and impedance becomes relatively high. Particularly, potential of the conductive material 14 in the trenches 3, which are not coupled with the electrode 9a directly, may not be fixed to the predetermined potential stably.

In a semiconductor device of the present embodiment, the conductive material 14 inside the trenches 3 and over the rear side of the wafer substrate 2 is fixed to the predetermined potential by using the conductive plate 19 joined to the rear side of the wafer substrate 2.

Figure 6:
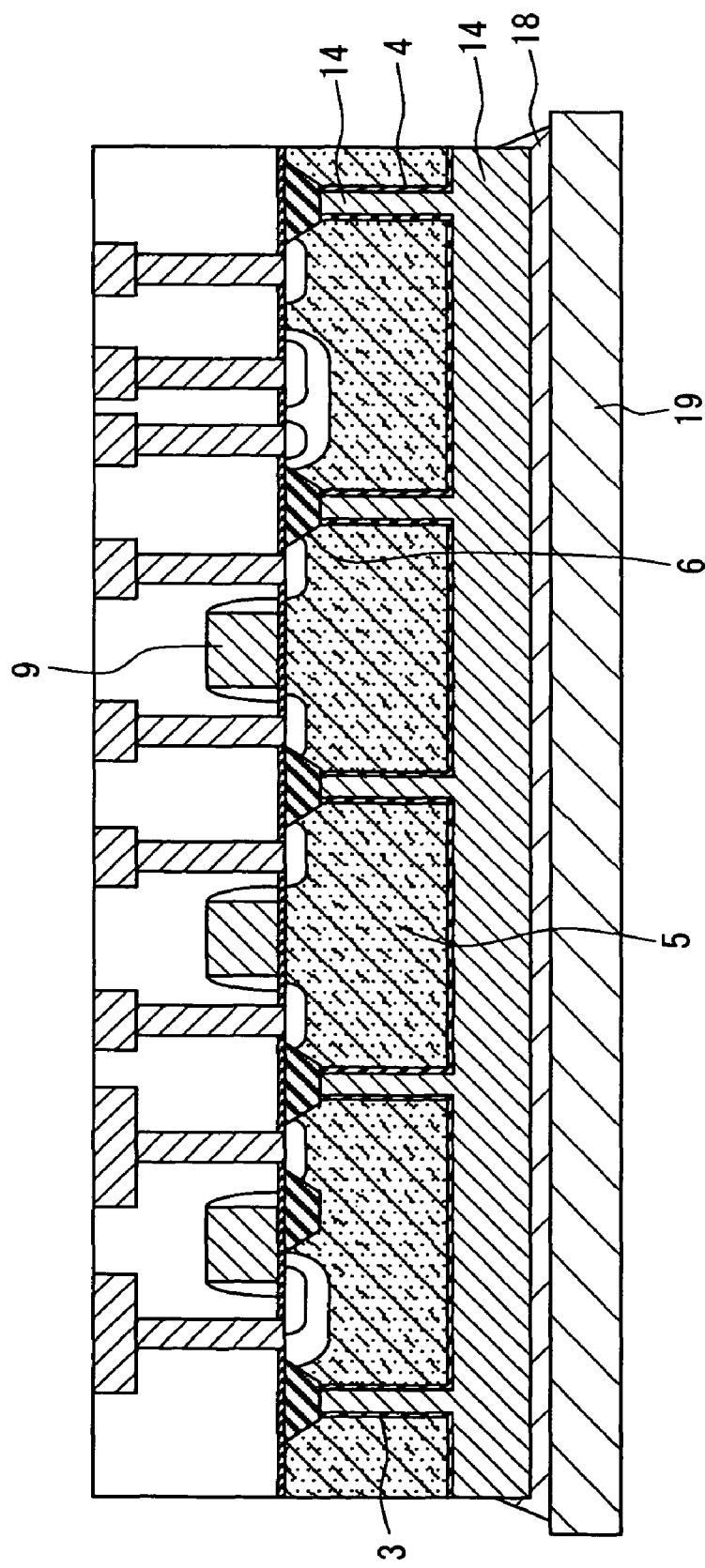
FIG. 6 is a cross sectional view showing a structure of a substantial portion of a semiconductor device having an element isolation structure according to a fourth embodiment.

FIG. 6 is a cross sectional view showing a structure of a substantial portion of the semiconductor device having an element isolation structure according to the fourth embodiment. As shown in FIG. 6, the conductive material 14 is formed inside the trenches 3 and over the rear side of the wafer substrate 2. In the present embodiment, the conductive plate 19 is joined to the conductive material 14 formed over the rear side of the wafer substrate 2, which is formed in this manner, through the conductive bonding member 18. The ground potential is applied to the conductive plate 19 as the predetermined potential. Thereby, the potential of the conductive material 14 inside the trenches 3 and over the rear side of the wafer substrate 2 through the conductive plate 19 can be fixed to the predetermined potential.

Particularly, in the present embodiment, the potential of the conductive material 14 is fixed by the conductive plate 19, which covers at least portions in which at least the trenches 3 are formed. In other words, since the potential of the conductive material 14 in one of the trenches 3 needs not to be fixed to the predetermined potential via the conductive material 14 having thin radius in another one of the trenches, the electrical connection with low impedance can become possible. Therefore, the potential of the conductive material 14 inside the trenches 3 and over the rear side of the wafer substrate 2 can be kept to the predetermined potential stably.

Figure 7:
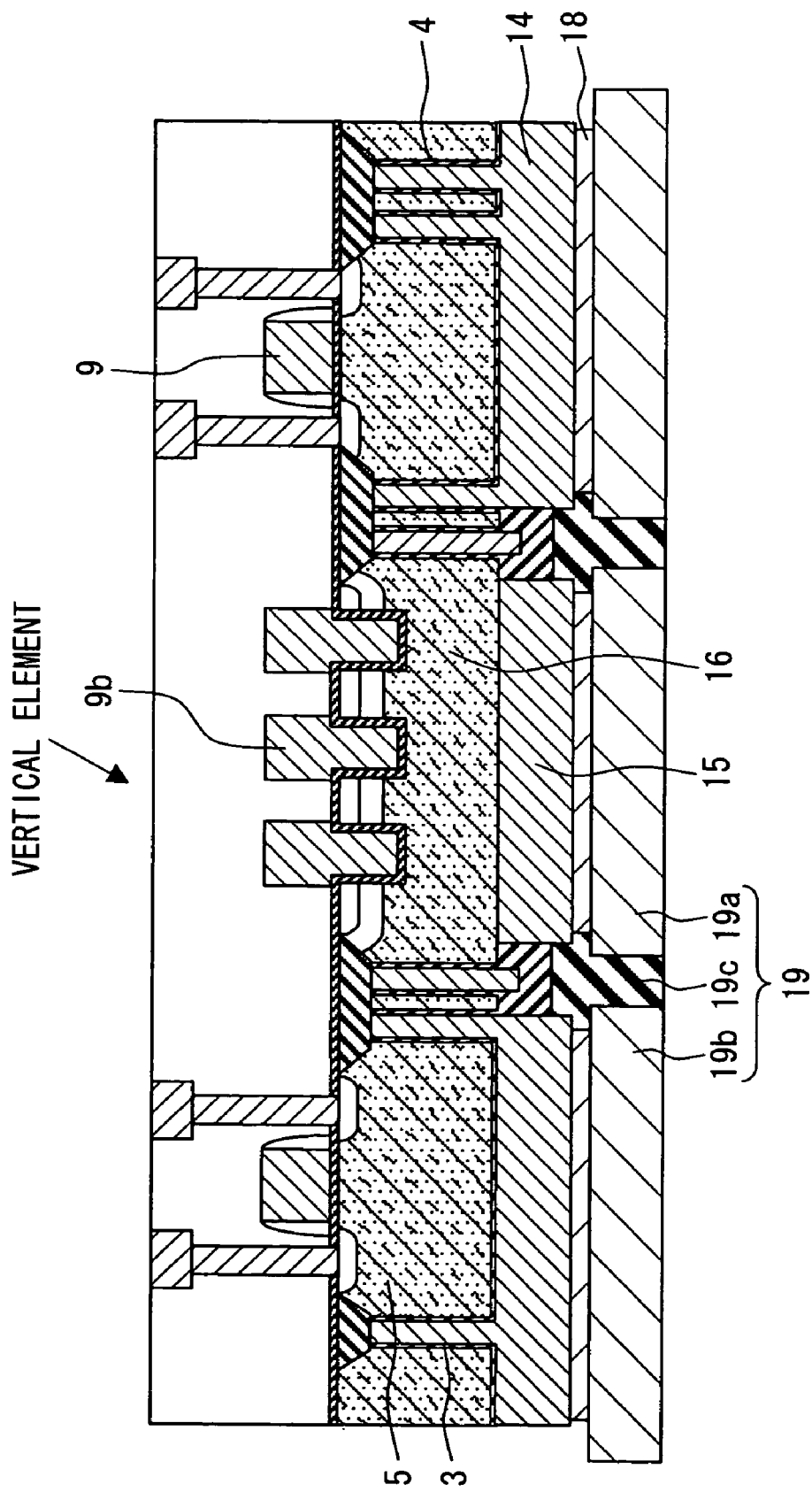
FIG. 7 is a cross sectional view showing a structure of a substantial portion of a semiconductor device according to a modification of the fourth embodiment.

Next, a modification of the fourth embodiment will be described. FIG. 7 is a cross sectional view showing a structure of a substantial portion of a semiconductor device according to a modification of the fourth embodiment. In the modification shown in FIG. 7, one of the element formation regions 5 is replaced by a vertical element formation region 16. The back surface electrode 15 of the vertical element formation region 16 is arranged at the rear side of the wafer substrate 2. The conductive plate 19 is divided into an electrode plate 19a coupled with the back surface electrode 15 and a conductive plate 19b coupled with the conductive material 14 in order to applying a predetermined potential to the conductive material 14 in the trenches 3 and over the rear side of the wafer substrate 2 by using the conducive plate 19 over the rear side of the wafer substrate 2. An insulating portion 19c is arranged between the electrode plate 19a and the conductive plate 19b, and the electrode plate 19a and the conductive plate 19b are isolated from each other.

In this configuration, the conductive material 14 in the trenches 3 and over the rear side of the wafer substrate 2 can be fixed, and the back surface electrode 15 of the vertical element formation region 16 can function as the connecting terminal by using the conductive plate 19.

As the conductive plate 19, a plate, in which the electrode plate 19a couples with the conductive plate 19b through the insulating portion 19c, may be prepared in advance, and then the plate is joined to the wafer substrate 2. Alternatively, after the conductive plate 19 is joined to the wafer substrate 2, a portion corresponding to the insulating portion 19c may be removed and an insulating material may be inserted to the removed portion.

Although the preferable embodiments are described, the present invention does not limit to the above-mentioned embodiments, and various modifications may be made without departing from the scope of the invention.

Figure 8:
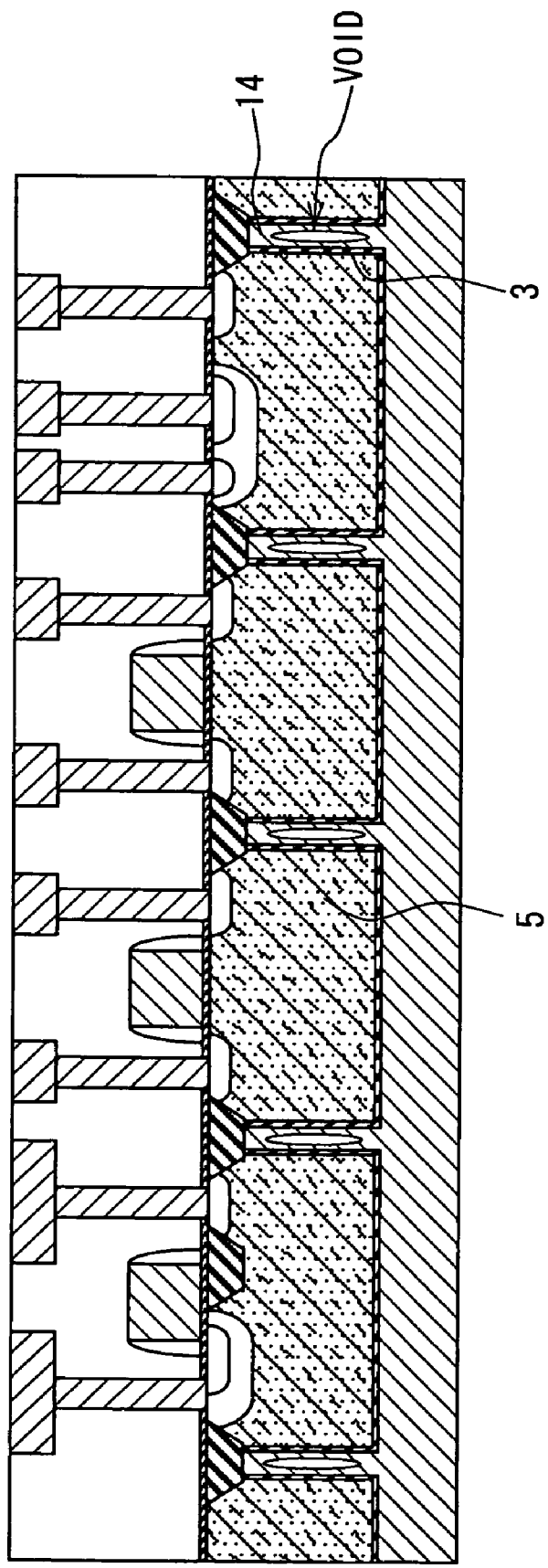
FIG. 8 is an explanation view showing a state that voids remains in a conductive material in trenches.

For example, as shown in FIG. 8, after the conductive material 14 is deposited in the trenches 3, voids may remain in vicinity of central axes inside the trenches 3. It takes a long time to fill the trenches 3 completely with the conductive material 14, so that the manufacturing cost increases. Moreover, since the conductive material 14 in the trenches 3 are arranged to prevent the interference of electric potential between the adjacent element formation regions 5, some voids do not disturb the function of the trenches 3.

Figure 9:
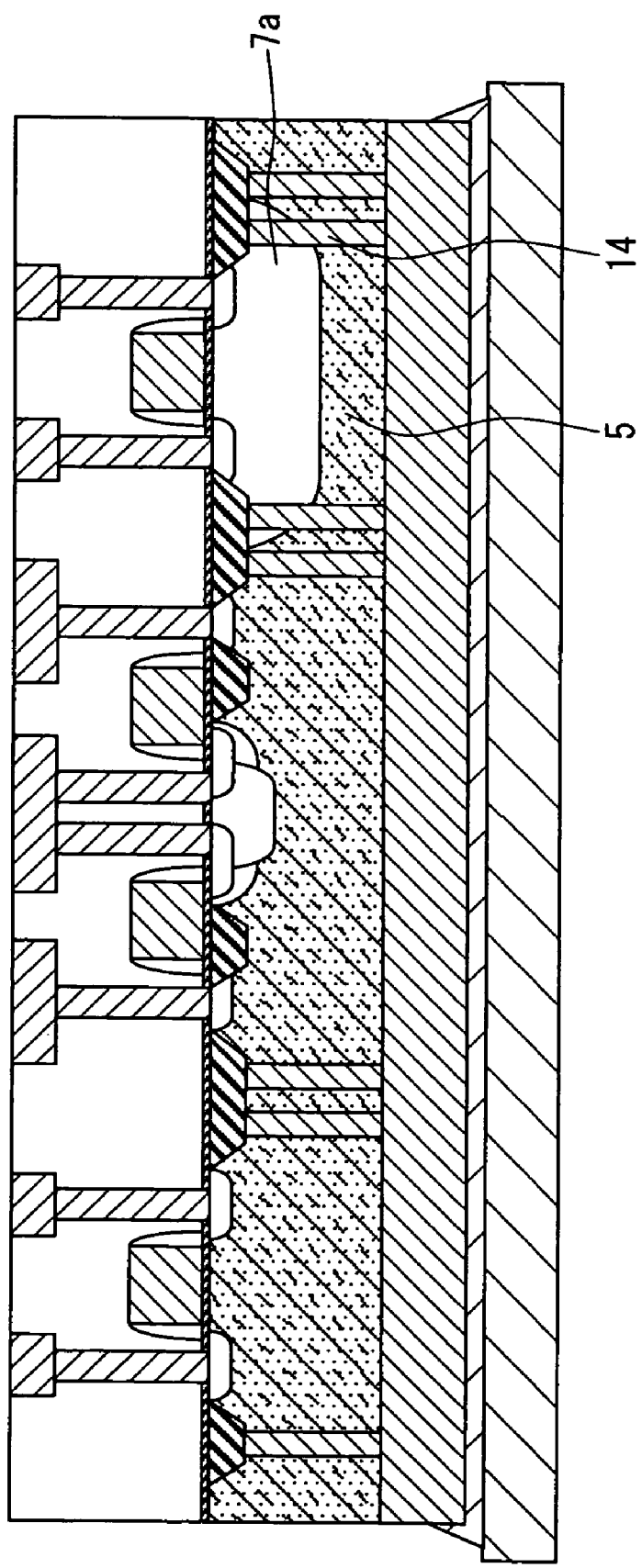
FIG. 9 is an explanation view showing a state that trenches intersect with a diffusion layer of an element formation region.

Moreover, as shown in FIG. 9, when the trenches 3 is formed in the wafer substrate 2, the trenches 3 may intersect with an impurity diffusion layer 7a in the element formation regions 5. Thereby, the dimensions of the elements, and the cost of the semiconductor chips 20 can be reduced.

In addition, the trenches 3 are formed to surround the element formation regions 5, for example. In case that the insulating layer 4 is formed inside the trenches 3 to isolate elements, various arrangements of the element formation regions are possible.

Figure 10:
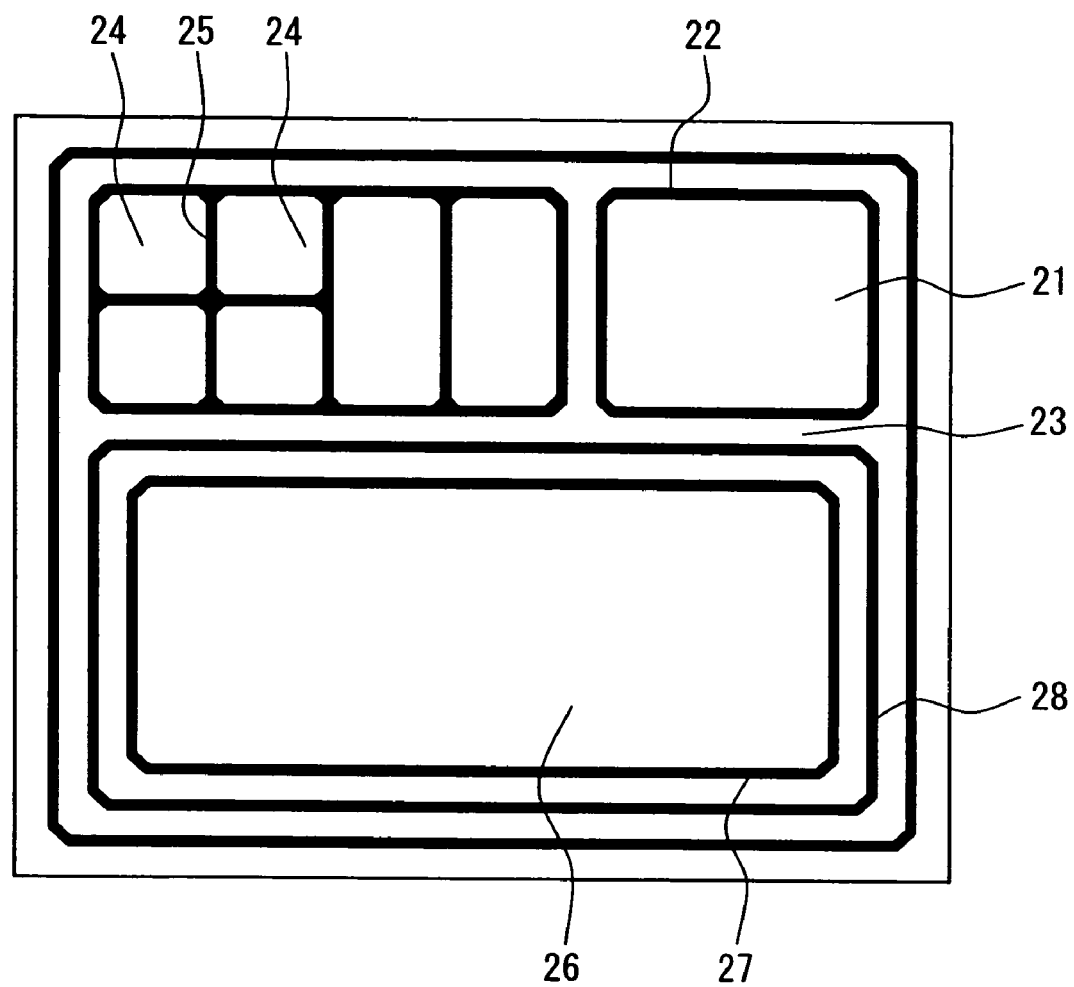
FIG. 10 is an explanation view showing an example of arrangement each of element formation regions, which are isolated by trenches.

For example, in FIG. 10, an element formation region 21 is surrounded by a trench 22, in which an insulating film is formed, and without contacting other element formation regions with a separation region (a field region) 23 interposed therebetween. In this case, testing for confirming insulating property of the trench 22 can be performed by applying voltage between the field region 23 and the element formation region 21. Moreover, the interference of electric potential of the element formation region 21 can be suppressed by fixing the potential of the field region 23.

Moreover, a plurality of element formation regions 24 may be arranged adjacent to each other by being separated with one trench 25. In this case, the element formation regions 24 can be arranged in the high density, and therefore, more semiconductor chips can be obtained from a wafer substrate 2.

In addition, an element formation region 26 may be isolated by being separated with a plurality of trenches 27 and 28. In this case, voltage can be shared by the plurality of trenches 27 and 28, and therefore, an element, to which the high voltage is applied, can be arranged in the element formation region 26.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device comprising:

preparing a semiconductor substrate having a main side and a rear side;

forming at least one of an active element and a passive element in each of a plurality of element formation regions of the substrate at the main side of the substrate;

forming an insulating film over the main side of the substrate;

thinning the substrate from the rear side of the substrate;

forming a plurality of trenches on the rear side of the substrate after the thinning the substrate, wherein each trench reaches the insulating film;

depositing a first insulating material over a sidewall of each trench and over the rear side of the substrate to form a first insulating layer with a first void in the trench, so that the plurality of element formation regions are isolated, wherein the first void is formed in the first insulating layer around a central axis of the trench; and depositing a first conductive material in the first void in each trench and over the rear side of the substrate, wherein the plurality of element formation regions are electrically shielded by fixing a potential of the first conductive material in each trench and over the rear side of the substrate, the element formation regions include a vertical element formation region having a back surface electrode over the rear side of the substrate, in the depositing the first conductive material, a second insulating layer is formed over the first conductive material, in the depositing the first conductive material, a second conductive material for providing the back surface electrode of the vertical element formation region is deposited over the rear side of the substrate, and the second insulating layer is disposed between the first conductive material and the second conductive material.

2. The method for manufacturing the semiconductor device according to claim 1, further comprising:

forming a conductive body over the insulating film; and removing a part of the insulating film over one of the trench from the rear side before the depositing the first conductive material, so that the conductive body is exposed from the rear side of the substrate, wherein, in the depositing the first conductive material, the first conductive material deposited in each trench is electrically coupled with the conductive body, so that the potential of the first conductive material in each trench and over the rear side of the substrate is fixed through the conductive body.

3. The method for manufacturing the semiconductor device according to claim 1, further comprising:

bonding a conductive plate to the second conductive material, wherein the second conductive material is formed to be thicker than the first conductive material, and wherein the conductive plate is electrically coupled with only the second conductive material.

4. The method for manufacturing the semiconductor device according to claim 1, further comprising:

bonding a conductive plate to the second conductive material, wherein the first conductive material and the second conductive material are laminated with the second insulating layer interposed therebetween, wherein the first conductive material is isolated from the conductive plate by the second insulating layer, and wherein the second conductive material penetrates the second insulating layer, so that the back surface electrode is electrically coupled with the conductive plate, and wherein the conductive plate is electrically coupled with only the second conductive material.

5. The method for manufacturing the semiconductor device according to claim 1, wherein the fixed potential of the first conductive material in each trench and over the rear side of the substrate is a ground potential.

6. The method for manufacturing the semiconductor device according to claim 1, wherein a melting point of the first conductive material is less than or equal to 1100 degree Celsius.

7. The method for manufacturing the semiconductor device according to claim 1, wherein a second void in the first conductive material in each trench remains around the central axis of the trench after the depositing the first conductive material.

8. A method for manufacturing a semiconductor device comprising:

preparing a semiconductor substrate having a main side and a rear side;

forming at least one of an active element and a passive element in each of a plurality of element formation regions of the substrate at the main side of the substrate;

forming an insulating film over the main side of the substrate;

thinning the substrate from the rear side of the substrate;

forming a plurality of trenches on the rear side of the substrate after the thinning the substrate, wherein each trench reaches the insulating film;

depositing a first insulating material over a sidewall of each trench and over the rear side of the substrate to form a first insulating layer with a first void in the trench, so that the plurality of element formation regions are isolated, wherein the first void is formed in the first insulating layer around a central axis of the trench;

depositing a first conductive material in the first void in each trench and over the rear side of the substrate; and bonding a conductive plate to the first conductive material, wherein the plurality of element formation regions are electrically shielded by fixing a potential of the first conductive material in each trench and over the rear side of the substrate, and the potential of the first conductive material in each trench and over the rear side of the substrate is fixed though the conductive plate.

9. The method for manufacturing the semiconductor device according to claim 8, wherein the element formation regions includes a vertical element formation region having a back surface electrode over the rear side of the substrate, and a part of the first conductive material disposed in the vertical element formation region provides the back surface electrode, wherein, a third insulating material is inserted between a first region and a second region in the conductive plate, and the conductive plate is a divided plate which is electrically divided by the third insulating material, wherein the first region is bonded to the first conductive material, and wherein the second region is bonded to the back surface electrode.

10. The method for manufacturing the semiconductor device according to claim 8, wherein the fixed potential of the first conductive material in each trench and over the rear side of the substrate is a ground potential.

11. The method for manufacturing the semiconductor device according to claim 8, wherein a melting point of the first conductive material is less than or equal to 1100 degrees Celsius.

12. The method for manufacturing the semiconductor device according to claim 8, wherein a second void in the first conductive material in each trench remains around the central axis of the trench after the depositing the first conductive material.

* * * * *